United States Patent
Skierbiszewski et al.

(10) Patent No.: US 7,936,798 B2
(45) Date of Patent: May 3, 2011

(54) NITRIDE BASED LASER DIODE AND METHOD OF MANUFACTURING NITRIDE BASED LASER DIODE

(75) Inventors: Czeslaw Skierbiszewski, Warsaw (PL); Sylwester Porowski, Warsaw (PL); Izabella Grzegory, Warsaw (PL); Piotr Perlin, Warsaw (PL); Michal Leszczyński, Lesznowola (PL); Marcin Siekacz, Turek (PL); Anna Feduniewicz-Zmuda, Rzeszów (PL); Przemyslaw Wiśniewski, Warsaw (PL); Tadeusz Suski, Nowy Prázmów (PL); Michal Boćkowski, Warsaw (PL)

(73) Assignee: Instytut Wysokich Cisnien Polskiej Akademii Nauk, Warszawa (PL)

( * ) Notice: Subject to any disclaimer, the term of this patent is extended or adjusted under 35 U.S.C. 154(b) by 504 days.

(21) Appl. No.: 11/660,345

(22) PCT Filed: Aug. 9, 2005

(86) PCT No.: PCT/PL2005/000050
§ 371 (c)(1), (2), (4) Date: Apr. 10, 2007

(87) PCT Pub. No.: WO2006/019326
PCT Pub. Date: Feb. 23, 2006

(65) Prior Publication Data
US 2008/0107144 A1 May 8, 2008

(30) Foreign Application Priority Data

Aug. 15, 2004 (PL) .......................................... 369597

(51) Int. Cl.
*H01S 5/00* (2006.01)

(52) U.S. Cl. ................ 372/45.01; 372/43.01; 372/46.01; 438/31; 257/E21.002

(58) Field of Classification Search ................ 372/45.01, 372/55, 43.01, 46.01; 438/31; 257/E21.002
See application file for complete search history.

(56) References Cited

U.S. PATENT DOCUMENTS 6,455,337 B1  9/2002  Sverdlov
6,829,273 B2 * 12/2004 Amano et al. .............. 372/45.01
(Continued)

OTHER PUBLICATIONS

Yu et al, "The effect of atomic hydrogen on the growth of gallium nitride by molecular beam epitaxy" Appl. Phys. Lett. 69 (18), p. 2731-2733, Oct. 1996.*

(Continued)

*Primary Examiner* — Minsun Harvey
*Assistant Examiner* — Yuanda Zhang
(74) *Attorney, Agent, or Firm* — Horst M. Kasper (57) ABSTRACT

The laser diode comprising crystalline substrate (1) where set of subsequent n-type layers, set of optically active layers (5) and set of p-type layers is deposited. The set of n-type layers comprise at least one buffer layer (2), bottom n-type cladding layer (3) and n-type bottom waveguide layer. The set of p-type layers comprise at least p-type upper waveguide, which comprises electron blocking layer, upper p-type cladding layer (7) and p-type contact layer (8). The electron blocking layer comprises $In_x, Al_y Ga_{1-x-y}, N$ alloy doped with magnesium where $1 \geq x > 0.001$ a $1 \geq y \, 0$. The way of making this invention is based on the epitaxial deposition of subsequent set of the n-type layers (2, 3, 4), set of optically active layers (5) and set of p-type layers (6, 7, 8) where the p-type waveguide layer (6) and p-type contact layer (7) is deposited with presence of indium in plasma assisted molecular beam epitaxy method.

19 Claims, 6 Drawing Sheets

U.S. PATENT DOCUMENTS

| | | | |
|---|---|---|---|
| 6,858,882 B2 * | 2/2005 | Tsuda et al. | 257/103 |
| 7,009,215 B2 * | 3/2006 | D'Evelyn et al. | 257/98 |
| 7,058,105 B2 * | 6/2006 | Lee et al. | 372/45.01 |
| 7,138,648 B2 * | 11/2006 | Kneissl et al. | 257/14 |
| 7,422,633 B2 * | 9/2008 | Dwilinski et al. | 117/68 |
| 2001/0030317 A1 | 10/2001 | Lee et al. | |
| 2002/0094002 A1 * | 7/2002 | Amano et al. | 372/45 |
| 2004/0099869 A1 * | 5/2004 | Gaska et al. | 257/79 |

OTHER PUBLICATIONS

C. R. Miskys et al, "MOCVD-Epitaxy on Free-Standing HVPE-GaN Substrates" phys. Stat. sol. (a) 176, 443-446, 1999.*

Prystawko P et al; "High power laser structures . . ."; pp. 274-277 Journal of Grystal Growth, Amsterdam NL, Dec. 2004.

Hooper, S et al; "InGaN multiple quantum . . ." pp. 33-34 Electronics Letters, IEE Stevange, GB vol. 401; Jan. 2004.

Dimakis, E et al; "Plasma Assisted MBE Growth . . ." p. 480; Journal of Grystal Growth; Amsterdam, NL, Apr. 2003.

Sato, H et al; "Blue Light-Emitting Diodes . . . " pp. 2193-2194 Physica Status Solidi C Wiley-VCH Germany, No. 7, 2003.

Skierbiszewski, C et al; "High Power Blue-Violet InGaN . . . " pp. 809-813; Semiconductor Science Ant Technology, Aug. 2005.

Skierbiszewski, C et al; "Blue-Violet InGaN . . ." pp. 11114.1-11114.3; Applied Physics Letters, Jan. 2005.

Journal of Crystal Growth 272 (2004) 274-277; "High-Power Laser Structures Grown on Bulk GaN Crystal" by Pawel Prystawko (et al.).

Journal of Crystal Growth 251 (2003) 476-480; "Plazma-Assisted MBE Growth of Quaternary InAlGaN Quantum Well Heterostructures With Room Temperature Living Science" by E. Dimakis (et al.).

XP-002350376, Oct. 20, 2003, Hitoshi Sato (et al.).

XP-002350377, Jun. 27, 2005, Skierbiszewski (et al.).

XP-002350378, Dec. 27, 2004, Skierbiszewski (et al.).

* cited by examiner

NITRIDE BASED LASER DIODE AND METHOD OF MANUFACTURING NITRIDE BASED LASER DIODE

TECHNICAL FIELD

Subject of this invention is a nitride based semiconductor laser diode and a method of manufacturing the nitride based laser diode by molecular beam epitaxy with the use of excited molecules and/or nitrogen atoms (RN MBE).

BACKGROUND ART

Semiconductor materials for a long time were synthesized by different epitaxial methods. There are several known epitaxial growth techniques such as liquid phase epitaxy (LPE), chloride vapor epitaxy (ClVPE), hydride vapor epitaxy (HVPE), molecular beam epitaxy (MBE), chemical beam epitaxy (CBE) and metal organic phase epitaxy (MOVPE). Details concerning MBE method are shown e.g. in work of M. A. Herman (M. A. Herman, H. Sitter "*Molecular Beam Epitaxy, Fundamentals and Current Status*" in Springer Series in Materials Science, 2$^{nd}$ Edition Springer-Verlag Berlin Heidelberg New York 1996, ISBN 3-540-60594-0).

Nitrogen exists as a two-atom molecules which binding energy is so high that nitrogen molecules can not decompose into single atoms (necessary for epitaxial growth) when they are in contact with hot substrate. Due to this fact, in nitride epitaxial process two methods of generation of active nitrogen atoms are used. In the first method atomic nitrogen is created as a result of ammonia ($NH_3$) decomposition (decomposition is possible due to the high temperature on grown substrate) but in parallel, atomic hydrogen is created. In second method, decomposition or excitation of nitrogen molecules takes place before supplying it to the surface.

Up to now, two methods of making semiconductor laser diodes based on gallium nitride, indium nitride, aluminum nitride and their alloys by epitaxial growth have been known—MOVPE and Gas Source MBE (GSMBE).

The MOVPE method, relies on making use of MOVPE epitaxy with ammonia ($NH_3$) described for instance in work of S. Nakamura (Shuji Nakamura, Gerhard Fasol "*The Blue Laser Diode, GaN Based Emitters and Lasers*" Springer-Verlag 1997 (ISBN 3-540-61590-3)). Using this method, in 1995 the first, pulsed operated, blue laser diode was demonstrated. Shortly after the continuous wave lasing was obtained in 1999, violet laser diodes with optical power of 5 mW were offered on the marked by Nichija company. Up until now, laser action was demonstrated in only few research groups (e.g three in USA, three in Europe including Institute of High Pressure PAS as well as one in Korea and one in Taiwan). Design and way of fabrication of a blue-violet semiconductor laser diode is described e.g. in the cited already work of S. Nakamura and G. Fasol (Shuji Nakamura, Gerhard Fasol "*The Blue Laser Diode, GaN Based Emitters and Lasers*" Springer-Verlag 1997 (ISBN 3-540-61590-3)). Example design of such diode consists of a sapphire substrate on which the following layers are grown: 30 nm GaN buffer, 3 μm GaN:Si, 0.1 μm $In_{0.05}Ga_{0.95}N$:Si, 0.5 μm $Al_{0.07}Ga_{0.93}N$:Si, 0.1 μm GaN:Si, three quantum wells (5 nm $In_{0.14}Ga_{0.86}N$ wells, 10 nm $In_{0.02}Ga_{0.98}N$ barriers), 20 nm $Al_{0.2}Ga_{0.8}N$:Mg, 0.1 μm GaN:Mg, 0.5 μm $Al_{0.07}Ga_{0.93}N$:Mg, 0.2 μm GaN:Mg. The p-type doping is reached by introduction into reactor chamber $Cp_2Mg$ compound.

The GSMBE method relies on epitaxial process where group V elements are supplied by gas sources. GSMBE of nitrides, similarly to MOVPE method uses $NH_3$ is a gas which delivers nitrogen to the layer and $Cp_2Mg$ as a source of p-type doping. Details of this method is shown e.g. in work by (S. E. Hooper, M. Kauer, V. Bousquet, K. Johnson, J. M. Barnes and J. Heffernan, *Electronic Letters vol.* 40, 8$^{th}$ Jan. 2004).

Thus, a common feature of the both methods is use of ammonia as a source of nitrogen in synthesized layers. During decomposition of ammonia on the hot surface, large quantity of hydrogen is released, which enters into the grown crystal and may deteriorate the layers quality. For instance, hydrogen compensates magnesium acceptors (bond H—Mg is created) and special thermal procedure is required after the growth process to activate p-type conductivity as shown earlier in the work of S. Nakamura and G. Fasol. Although authors of the GSMBE method claim that there is no need for thermal activation of the layers after the growth process in order to achieve p-type conductivity, the inferior parameters of laser diodes produced by the GSMBE may be due to the difficulties in Mg activation in the layers far away from the surface in the vicinity of the quantum wells. In general, it is worth to note that hydrogen which is present in high concentration in layers grown with $NH_3$ may degrade quality and change parameters of layers grown by MOVPE and GSMBE. This can impact negatively properties such as stability of InGaN quantum wells or raise the values of threshold current density.

In epitaxial growth technology a molecular beam epitaxy method is also known, called Reactive Nitrogen MBE (RN-MBE), which uses chemically active atoms and molecules of nitrogen. One of the versions of the RN-MBE is Plasma Assisted MBE (PAMBE). PAMBE relies on the fact that constituent layer atoms such as Ga, In, Al, Si, Mg are supplied by evaporation of these species from effusion cells (where flux of given components is a function of the temperature of effusion cell). The active nitrogen in the PA MBE is supplied by the plasma unit in a form of a beam of excited molecules and atoms. The plasma unit is a device which excites (or dissociates) nitrogen molecules (in order to create nitrides of gallium, indium, aluminum and their alloys). For instance, it may be a device where radio-frequency radiation (RF plasma source) or cyclotron resonance effect (ECR plasma source) excites nitrogen molecules.

DISCLOSURE OF INVENTION

Laser diode according to this invention comprises crystalline substrate on which in sequence a set of n-type layers, an optically active set of layers and a set of p-type layers is grown. Said set of n-type layers comprises at least buffer layer, bottom n-type cladding layer and bottom n-type waveguide layer. Said set of p-type layers comprises at least an upper p-type waveguide layer containing electron blocking layer (EBL), upper p-type cladding layer and p-type contact layer. In such structure the said electron blocking layer comprises magnesium-doped alloy $In_xAl_yGa_{1-x-y}N$ where $1 \geq x > 0.001$ a $1 \geq y \geq 0$.

In one variety of this laser diode the hydrogen concentration in said electron blocking layer is less than $5 \times 10^{17}$ $cm^{-3}$.

In another variety of this laser diode the said upper p-type cladding layer comprises magnesium-doped set of layers, in which at least in one layer indium content is higher than 0.001 and hydrogen concentration in said cladding layer is lower than $5 \times 10^{17}$ $cm^{-3}$.

In another variety of this laser diode the said upper p-type cladding layer comprises set of magnesium-doped layers in which in all layers indium content is higher than 0.001.

In yet another variety of this laser diode the hydrogen concentration in said p-type cladding layer is lower than $5 \times 10^{17}$ cm$^{-3}$.

According to the invention said crystalline substrate of this laser diode can be HVPE substrate with dislocation density of less than $10^8$ cm$^{-2}$, or ELOG substrate with dislocation density less than $10^8$ cm$^{-2}$.

In another variety of the laser diode according to the invention dislocation density in said crystalline substrate is less than $10^5$ cm$^{-2}$.

In yet another variety of this laser diode the said crystalline substrate is substrate made by high pressure method and with dislocation density less of than $10^3$ cm$^{-2}$.

Method according to this invention is based on depositing epitaxially on crystalline substrate sequentionally a set of n-type layers, an optically active set of layers and a set of p-type layers. Said set of n-type layers comprises at least a buffer layer, a bottom n-type cladding layer and a bottom n-type waveguide layer. Said set of p-type layers comprises at least an upper p-type waveguide layer containing electron blocking layer (EBL), upper p-type cladding layer and p-type contact layer. According to the invention the said p-type waveguide layer and p-type cladding layer are grown by PAMBE in the presence of indium.

In one variety of the method according to the invention the said electron blocking layer is grown by PAMBE in the presence of indium.

In another variety of this method p-type cladding layer is grown by PAMBE in the presence of indium.

In another variety of this method the said n-type cladding layer is grown by PAMBE in the presence of indium.

In the method according to the invention an HVPE substrates with dislocation density less than $10^8$ cm$^{-2}$, ELOG substrates with dislocation density less than $10^8$ cm$^{-2}$, a crystalline substrates with dislocation density less than $10^5$ cm$^{-2}$ or a substrate made by high pressure method and with dislocation density less than $10^3$ cm$^{-2}$ can be used as the said crystalline substrate for epitaxial depositing.

In the way of making this invention, the epitaxial growth of nitrides is performed without presence of hydrogen, which allows for full control of p-type conductivity and improve of efficiency of quantum wells and can decrease the lasing threshold current. Presence of indium during growth enables growth of ideal flat layers by step flow atomic epitaxy in all range of the Al and In content. It enables a design of laser diode in wide range of emitted light from deep UV to near infrared, limited solely by energy gap of AlN and InN.

BRIEF DESCRIPTION OF DRAWINGS

This invention will be explained on the basis of drawings where:

FIG. 2. presents sample holder and way of mounting the substrate for growth using molybdenum springs, FIG. 3 indicates the energy spectrum of semiconductor laser diode made by PAMBE below and above the lasing threshold current density, FIG. 4. shows the optical power and voltage as a function of current for the semiconductor laser diode made by the PAMBE, FIG. 5. shows the Ga flux (determined by the Monitor Ion Gauge) as a function of the gallium effusion cell temperature, FIG. 6. shows the Ga flux (determined by the Monitor Ion Gauge) as a function of the additional gallium effusion cell temperature, FIG. 7. shows the In flux (determined by the Monitor Ion Gauge) as a function of the indium effusion cell temperature, FIG. 8. shows the Al flux (determined by the Monitor Ion Gauge) as a function of the aluminum effusion cell temperature, FIG. 9. presents the Si concentration measured by the SIMS as a function of the Si effusion cell temperature, FIG. 10. shows the concentration of Mg measured by the SIMS as a function of the Mg effusion cell temperature.

MODE FOR CARRYING OUT THE INVENTION

Figure 1:
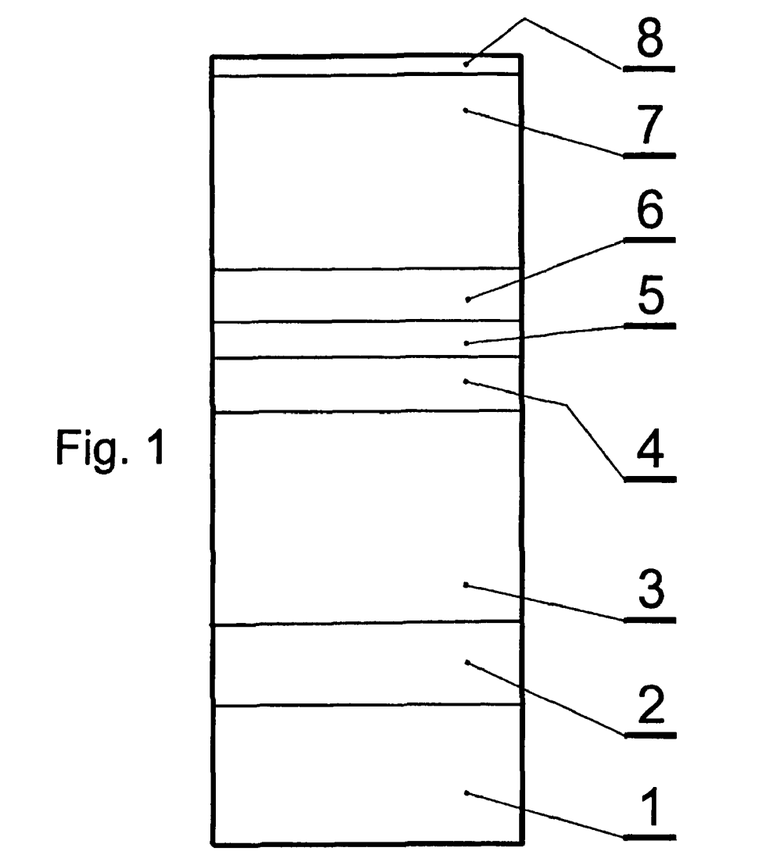
FIG. 1 shows schematically layer structure of semiconductor laser diode.

Typical structure of semiconductor laser diode is shown in FIG. 1. Set of n-type layers (2, 3, 4), set of optically active layers 5 and set of p-type layers (6, 7, 8) are consecutively grown on crystalline substrate 1 (e.g. on bulk GaN). The set of n-type layers comprises at least buffer layer 2, bottom cladding layer 3 and bottom part of the waveguide. The set of the p-type layers comprises at least upper wave guide (which also includes not indicated in this Figure electron blocking layer), upper cladding layer 7 and contact layer 8.

Making use of this laser diode structure, below a number of examples of making laser diode according to the invention have been shown.

Example I

Design and fabrication of semiconductor laser diode, where optically active region 5 consists of five InGaN/InGaN quantum wells on the base of gallium nitride, indium nitride aluminum nitride and its alloys, which emits light at the wavelength of 408 nm.

a) Substrate Preparation

Figure 2:
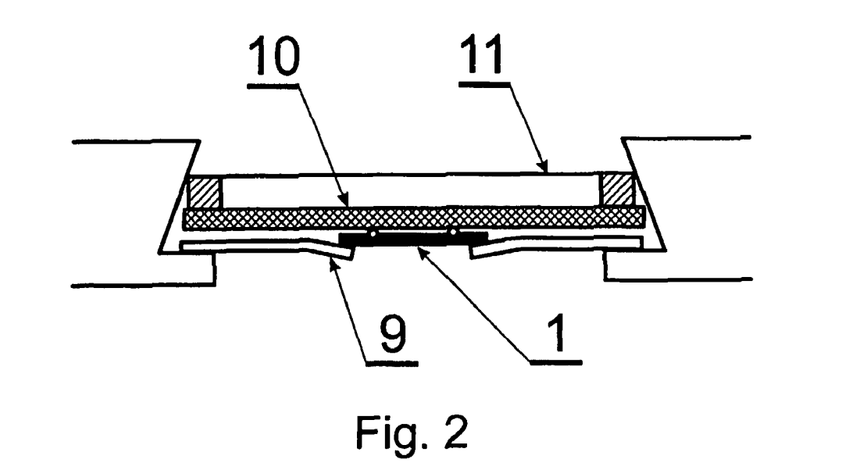

Crystalline substrate 1 with dislocation density lower than $10^5$ cm$^{-2}$ was prepared for growth according to method described in the Polish patent No 180448. As a result of such procedure a crystal surface was obtained covered by atomic steps of the width which is related to the degree of crystal disorientation. For disorientation equal to 1° the width of the atomic steps was equal to 14.3 nm. Next, the back side of the crystal 1 was covered by 1 μm of molybdenum. Molybdenum layer allows for uniform heating of the substrate during the MBE growth. Mounting of the crystalline substrates for MBE growth is in the way called "gravity mounting" which relies on the suspension of the substrate 1 on special springs 9 and subsequent covering the substrate by sapphire plate 10. Molybdenum retaining ring 11 allows mechanical stability of this mounting. The system with the springs is located in some distance from MBE heater and the heating of the substrate 1 is realized by absorption of radiation from the heater (maximum of radiation energy is in the infrared region). Substrate prepared in such way was loaded to VG-90 Oxford Instruments MBE system. Then it was outgases in the outgassing stage for 24 hours at 450° C. and then for 30 minutes at 600° C. After reaching the vacuum level below $1 \times 10^{-10}$ torr, substrate was transferred to the growth chamber. Next steps of laser diode growth, described in steps b) to h) of the Example I, were made in growth chamber of VG-90 Oxford Instruments MBE system.

b) Growth of Buffer Layer 2.

For epitaxial growth of layers, the molecular beam epitaxy system equipped with chemically active source of nitrogen atoms and molecules (Reactive Nitrogen MBE) was used. In particular, the plasma assisted MBE method is one of the implementations of RN MBE. In this technique, atoms which build layers such as Ga, In, Al, Si, Mg are originated from evaporation of these atoms from effusion cells (where flux of impinging atoms is a function of the temperature of the effusion cell) while nitrogen is supplied from the flux of excited molecules or/and nitrogen atoms originating from the plasma source unit. The plasma source is a device which excites (or dissolves) nitrogen molecules and enables growth of GaN, InN, AlN and their alloys. For example, it can be device which make use of radio frequency (RF) microwave excitation of molecules which comprise nitrogen (RF plasma source) or making use of cyclotron resonance effect (ECR plasma source). In the Example I RF plasma source device was used (Unibulb EPI-RFS-450-G-N made by Veeco).

Figure 7:
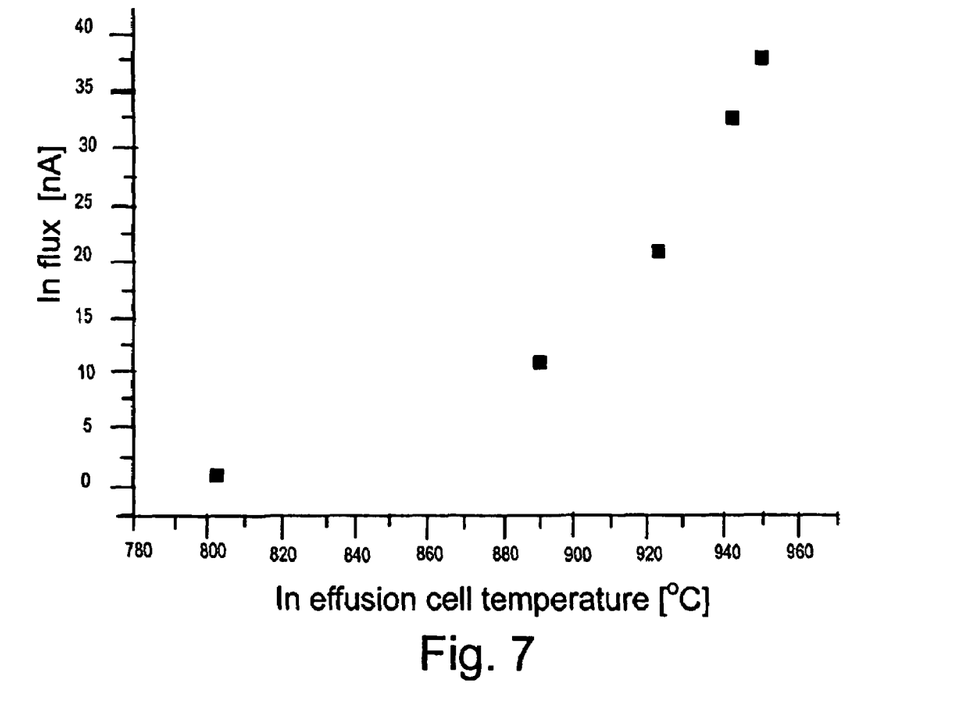
Figure 8:
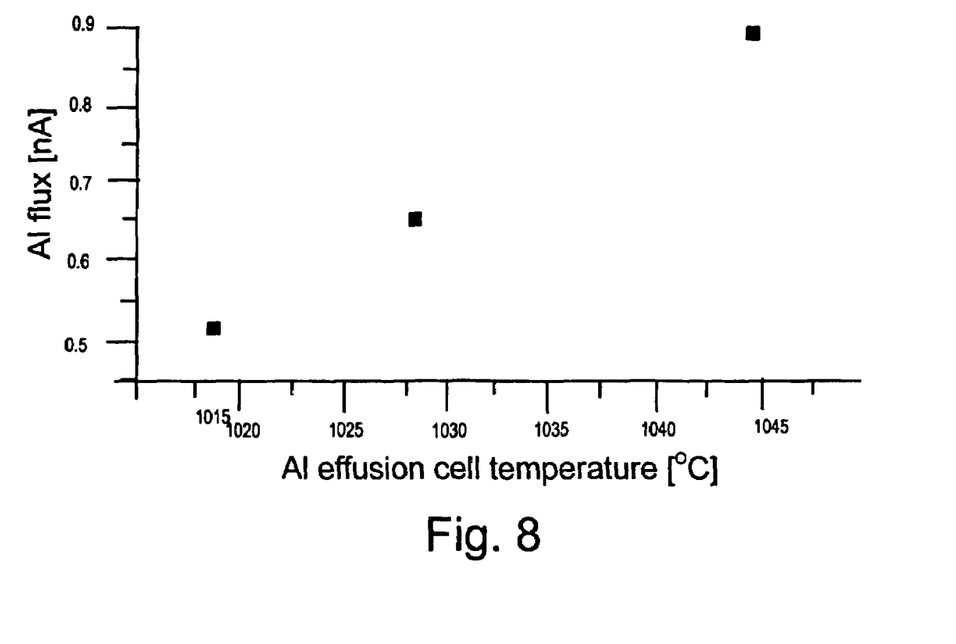
Figure 9:
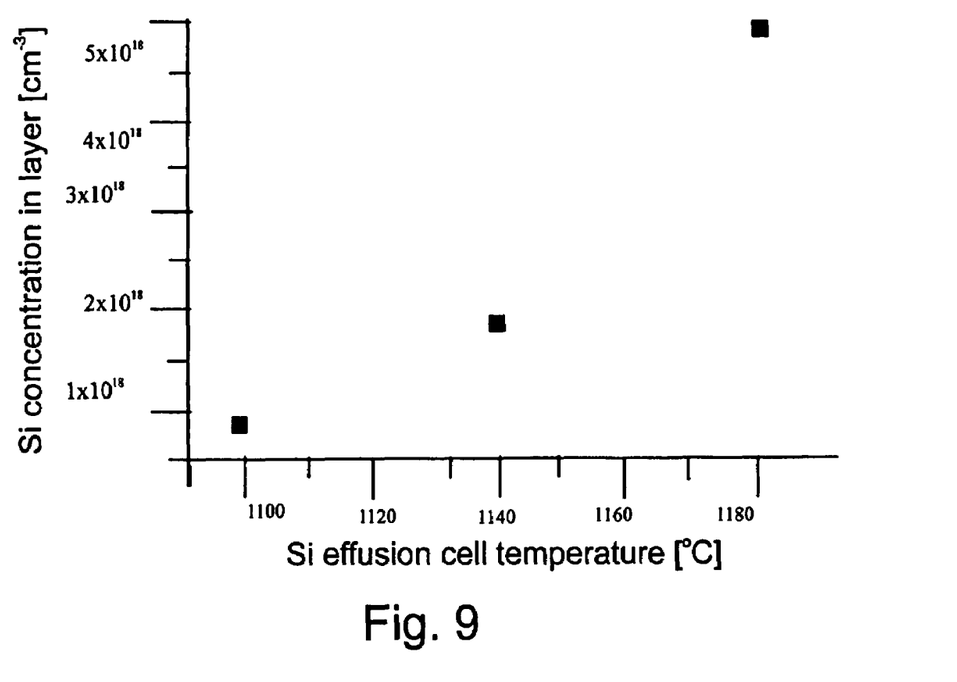

The substrate 1 (in vacuum conditions better than $5\times10^{-10}$ torr) was heated to 710° C. in the growth chamber. The Ga effusion cell was heated to 1010° C. (effusion cell made by Veeco, VG-300-SUMO-L) and Si effusion cell to 1180° C. (effusion cell made by Oxford Instruments, VG-40cc/KM-28 standard). On FIGS. 7, 8 and 9 the Ga, In, and Al fluxes as a function of Ga, In, Al effusion cells temperatures (measured by Monitor Ion Gauge made by Varian using ion current of 1 mA) are shown. Next the flow of high purity nitrogen (at the level better than 1 ppb) was established at the level of 1 sccm. The nitrogen flow was controlled by mass flow controller. Then the RF plasma source was switched on (Unibulb EPI-RFS-450-G-N made by Veeco) at power of 240 W. After opening the Ga, Si cells' and N plasma source's shutters for 20 minutes, the 0.1 μm of GaN doped with Si was grown. The Si doping level was $5\times10^{18}$ cm$^{-3}$ (measured by SIMS after growth). Then the Ga, Si cells' and N plasma source's shutters were closed.

c) Growth of the Bottom n-Type Cladding Layer 3.

The substrate 1 (in vacuum conditions better than $5\times10^{-10}$ torr) was heated to 710° C. in the growth chamber. The parameters of the plasma source operation were established according to step b) of the Example I. After heating of Ga effusion cell to 1007° C., Si effusion cell to 1180° C. and Al effusion cell to 1025° C. (VG-300-SUMO-Al-L made by Veeco) the Ga, Al, Si cells' and N plasma source's shutters were opened. Then for 100 minutes 0.5 μm of $Al_{0.08}Ga_{0.92}N$ doped with the Si at the level of $5\times10^{18}$ cm$^{-3}$ was grown (Si concentration was determined by SIMS—FIG. 9). Then the Ga, Al, Si effusion cells' and N plasma source's shutters were closed.

d) Growth of the Bottom n-Type Waveguide Layer 4

The substrate 1 with layers 2 and 3 was heated to 710° C. The Ga effusion cell was heated to 1007° C., Si effusion cell was heated to 1180° C. and parameters of the plasma source was established according to step b) of the Example I. After opening Ga and Si cells' as well as N plasma source's shutters for 20 minutes, 0.1 μm of GaN doped with Si at the level of $5\times10^{18}$ cm$^{-3}$ was grown. Then the Ga, Al, Si cells' and N plasma source's shutters were closed. Then the Ga effusion cell was heated to 970° C., the Si effusion cell was heated to 1180° C. and In effusion cell was heated to 890° C. (effusion cell made by Oxford Instruments, VG-40cc/KM-28 standard). The parameters of the N plasma source was established according to step b) of the Example I. Then the substrate was heated to 620° C. and next the In, Ga, Si cells' and N plasma source's shutters were opened for 6 minutes, 30 nm of $In_{0.02}Ga_{0.98}N$ doped with Si at the level of $5\times10^{18}$ cm$^{-3}$ was grown. Then the In, Ga, Si cells' and N plasma source's shutters were closed.

e) Growth of the Set of Optically Active Layers 5

In the semiconductor laser diode structures, the number of the optically active quantum wells is varied between 1 and 20. The procedure described in steps (A) and (B) was repeated N−1 times, where N is a number of quantum wells.

For instance for five quantum wells laser diode, procedure described in step (A) and (B) is repeated 4 times.

Step (A): The substrate 1 with layers 2, 3, and 4 was heated to 620° C. The parameters of the plasma source was established according to step b) of the Example I. The Ga effusion cell was heated to 963° C. and the In effusion cell was heated to 890° C. Then Ga, In cell's and N plasma source's shutters were open for 36 seconds and 3 nm of $In_{0.12}Ga_{0.88}N$ was grown. Then the Ga, In cells' and N plasma source's shutters were closed.

Step (B): The substrate 1 with layers 2, 3, and 4 was heated to 620° C. The parameters of the plasma source was established according to step b) of the Example I. The Ga effusion cell was heated to 970° C., the In effusion cell was heated to 890° C. and Si effusion cell was heated to 1180° C. Then Ga, In, Si effusion cell's and N plasma source's shutters were open for 84 seconds and 7 nm of $In_{0.02}Ga_{0.98}N$ doped with Si at the level of $5\times10^{18}$ cm$^{-3}$ was grown. Then the Ga, In cells' and N plasma source's shutters were closed.

After repeating steps (A) and (B) four times, the substrate 1 was heated to 620° C., the Ga effusion cell was heated to 963° C. and the In effusion cell was heated to 890° C. The parameters of the plasma source was established according to step b) of the Example I. Then Ga, In effusion cells' and N plasma source's shutters were open for 36 seconds and 3 nm of $In_{0.12}Ga_{0.88}N$ was grown. Then the Ga, In cells' and N plasma source's shutters were closed. Next the substrate 1 was heated to 620° C., the Ga effusion cell was heated to 970° C. and the In effusion cell was heated to 890° C. The parameters of the plasma source was established according to step b) of the Example I. Then Ga, In cells' and N plasma source's shutters were open for 12 seconds and 1 nm of $In_{0.02}Ga_{0.98}N$ was grown. Then the Ga, In cells' and N plasma source's shutters were closed.

f) Growth of the Upper Waveguide Layer 6

Figure 10:
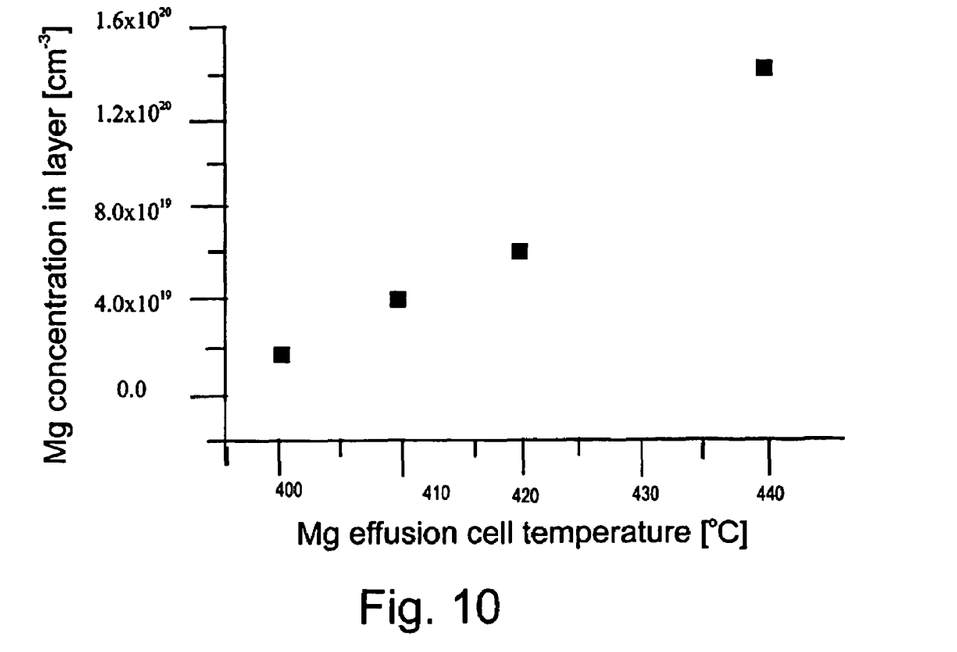

The substrate 1 with layers 2, 3, 4 and 5 was heated to 620° C., the Ga effusion cell was heated to 958° C. and the In effusion cell was heated to 890° C., Al effusion cell was heated to 1045° C. and Mg effusion cell (effusion cell made by Oxford Instruments, VG-40cc/KM-28 standard) to 420° C. Next the parameters of the plasma source was established according to step b) of the Example I. Then Al, Ga, In, Mg cells' and N plasma source's shutters were open for 4 minutes and 20 nm of $In_{0.02}Al_{0.16}Ga_{0.82}N$ doped with Mg at the level of $7\times10^{19}$ cm$^{-3}$ was grown. It is electron blocking layer. The amount of hydrogen in electron blocking layer measured by SIMS was lower than $1\times10^{17}$ cm$^{-3}$. Then Al, Ga, In, Mg cells' and N plasma source's shutters were closed. The Ga effusion cell was heated to 970° C., the In effusion cell was heated to 890° C. and the Mg effusion cell was heated to 420° C. Then the Ga, In, Mg cells' and N plasma source's shutters were open for 14 minutes and 70 nm of $In_{0.02}Ga_{0.98}N$ doped with Mg at the level of $7\times-10^{19}$ cm$^{-3}$ (determined by SIMS—FIG. 10) were grown. Then the Ga, In, Mg cells' and N plasma source's shutters were closed.

g) Growth of Upper p-Type Cladding Layer 7

The substrate 1 with layers 2, 3, 4, 5 and 6 was heated to 620° C., the Ga effusion cell was heated to 958° C., the In effusion cell was heated to 890° C., Al effusion cell was heated to 1045° C. and Mg effusion cell to 420° C. The parameters of the plasma source was established according to step b) of the Example I. Then Al, Ga, In, Mg cells' and N plasma source's shutters were open for 30 seconds and 2.5 nm of $In_{0.02}Al_{0.16}Ga_{0.82}N$ doped with Mg at the level of $7\times10^{18}$ cm$^{-3}$ was grown. Then Al, Ga, In, Mg cells' and N plasma source's shutters were closed. Then substrate was heated to 620° C., the Ga effusion cell was heated to 970° C., the In effusion cell was heated to 890° C. and Mg effusion cell to 420° C. The parameters of the plasma source was established according to step b) of the Example I. Then Al, Ga, In, Mg cells' and N plasma source's shutters were open for 30 seconds and 2.5 nm of $In_{0.02}Ga_{0.98}N$ doped with Mg was grown. Then Ga, In, Mg cells' and N plasma source's shutters were closed. The above procedure was repeated 80 times.

h) Growth of the Contact Layer 8

Figure 3:
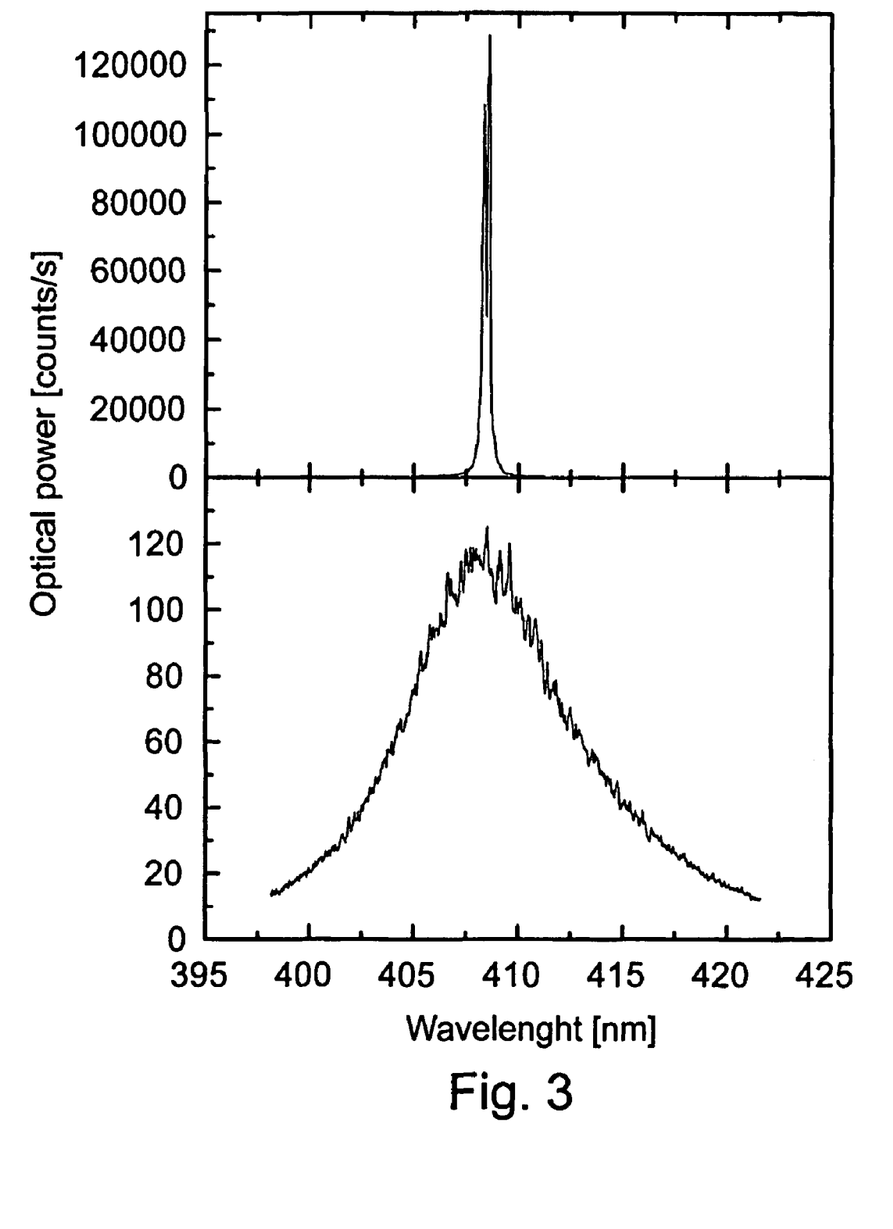
Figure 4:
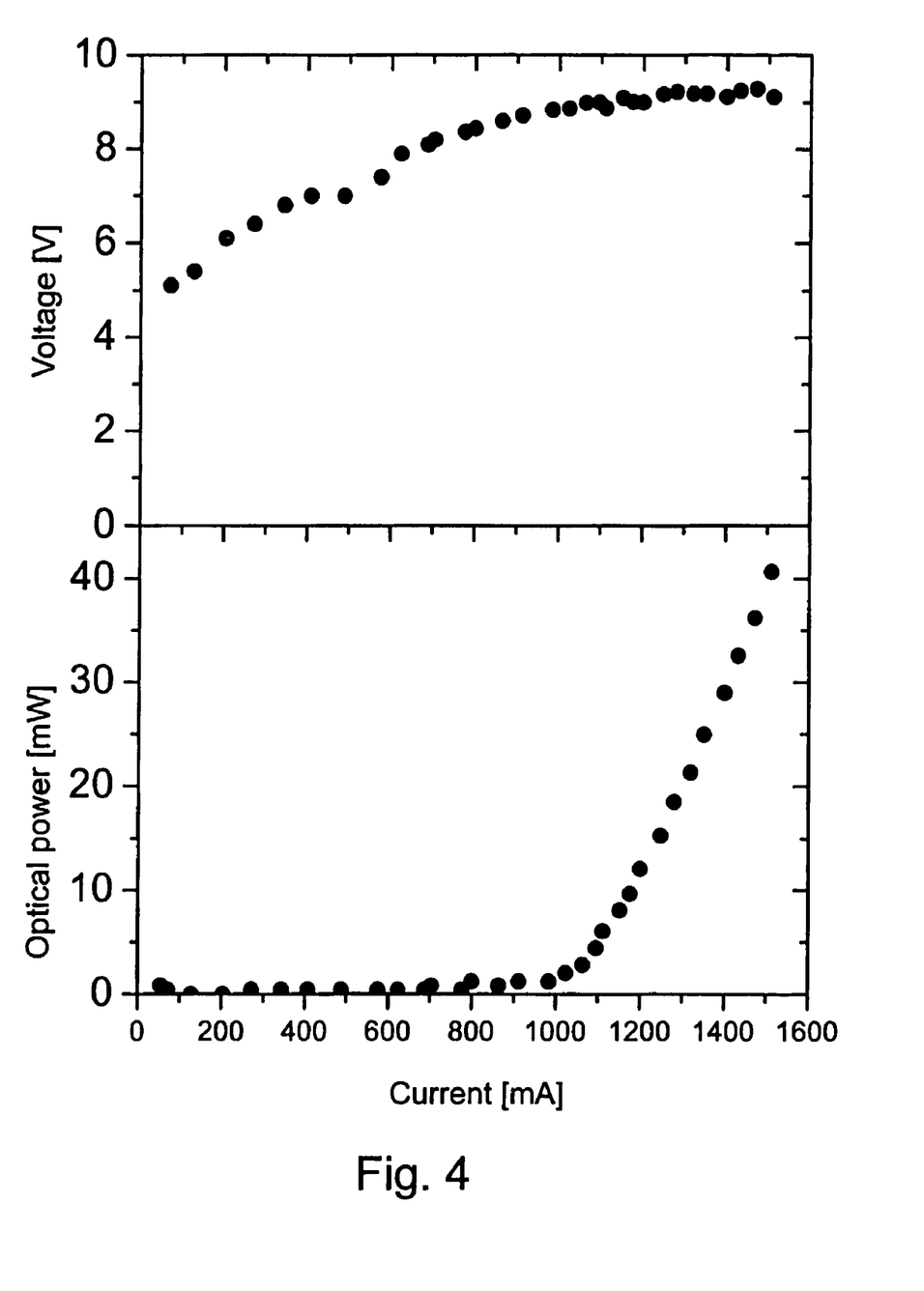
Figure 5:
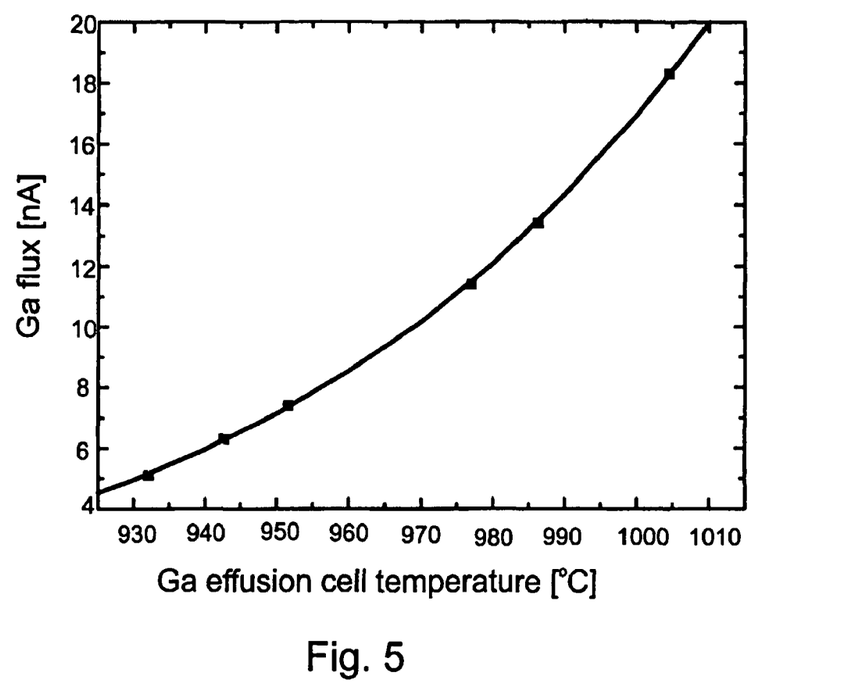

The substrate 1 with layers from 2 to 7 was heated to 620° C. The Ga effusion cell was heated to 970° C., the In effusion cell was heated to 890° C. and Mg effusion cell was heated to 420° C. The parameters of the plasma source was established according to step b) of the Example I. Then Ga, In, Mg cells' and N plasma source's shutters were open for 4 minutes and 20 nm of $In_{0.02}Ga_{0.98}N$ doped with Mg was grown. Then Ga, In, Mg cells' and N plasma source's shutters were closed and the substrate 1 with layers from 2 to 8 was cooled down to 30° C. and removed from MBE. On FIG. 3 the spectral characteristic of the semiconductor laser diode is shown. The set of layers for these diode was grown according the Example I. Working devices with dimensions 0.3 mm×0.1 mm×0.5 mm with 15 μm×500 μm ridge waveguide active region were fabricated by standard processing procedure where laser mirrors were made by cleaving. FIG. 4 presents the voltage-current characteristics and optical power dependence as a function of current.

Example II

Design and fabrication of semiconductor laser diode, where optically active region 5 consists of five InGaN/InGaN quantum wells on the base of gallium nitride, indium nitride aluminum nitride and its alloys, which emits light at the wavelength of 408 nm with modified contact layer 8.

a) The substrate 1 preparation and growth of the layers from 2 to 7 were made according steps from a) to g) of the Example I.

h) The substrate 1 with obtained layers from 2 to 7 was heated to 620° C. The Ga effusion cell was heated to 970° C., the In effusion cell was heated to 890° C. and Mg effusion cell was heated to 420° C. The parameters of the plasma source was established according to step b) of Example I. Then Ga, In, Mg effusion cells' and N plasma source's shutters were opened for 4 minutes and 20 nm of $In_{0.02}Ga_{0.98}N$ doped with Mg was grown. Then Ga, In, Mg effusion cells' and N plasma source's shutters were closed and the Ga effusion cell was heated to 963° C., the In effusion cell was heated to 890° C. and Mg effusion cell to 420° C. The parameters of the plasma source was established according to step b) of the Example I. Then. Ga, In, Mg effusion cells' and N plasma source's shutters were opened for 36 seconds and 3 nm of $In_{0.12}Ga_{0.88}N$ doped with Mg was grown. Then Ga, In, Mg effusion cells' and N plasma source's shutters were closed and substrate 1 with layers from 2 to 8 was cooled down to 30° C. and removed from MBE.

Example III

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm where active region 5 is made with use of two Ga Sources.

a) The substrate 1 preparation and growth of the layers from 2 to 4 were made according to steps from a) to d) of the Example I.

e) Growth of the Set of Optically Active Layers 5

Figure 6:
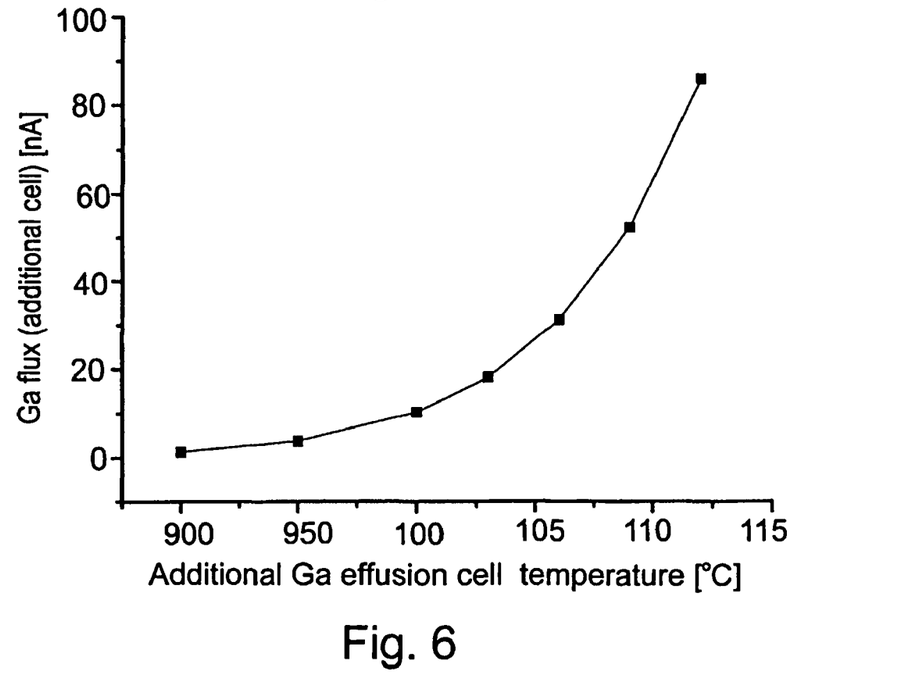

For growth of two quantum wells (in semiconductor laser diode the number of quantum wells is varied between 1 and 20) the following procedure has been applied. Substrate 1 with layers 2, 3 and 4 was heated to 620° C. The Ga effusion cell was heated to 963° C., additional Ga effusion cell was heated to 969° C. (effusion cell made by Oxford Instruments, VG-40cc/KM-28 standard—the Ga flux as a function of the temperature for this cell is given in FIG. 6), the Si effusion cell was heated to 1180° C., the In effusion cell was heated to 890° C. The parameters of the plasma source was established according to point b) of the Example I. Then Ga, In effusion cells' and N plasma source's shutters were opened for 36 seconds and 3 nm of $In_{0.12}Ga_{0.88}N$ was grown. Then the shutters of Si and additional Ga effusion cells were opened for 84 seconds and 7 nm of $In_{0.02}Ga_{0.98}N$ doped with Si at the level $5\times10^{18}$ cm$^{-3}$ was grown. Then shutters of the Si and additional Ga effusion cells were closed and for 36 seconds 3 nm of $In_{0.12}Ga_{0.88}N$ was grown. Then the shutter of additional Ga cell was open for 12 seconds and 1 nm of $In_{0.02}Ga_{0.98}N$ was grown. Then the shutters of Ga, In, additional Ga effusion cells and N plasma source were closed.

The growth of the layers 6, 7 and 8 was performed according steps f) to h) of the Example I.

Example IV

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm where active region 5 is made with use of two Ga sources and electron blocking layer is located after last quantum well.

a) Preparation of the substrate 1 and growth of the layers 2, 3 and 4 were made according to steps a) to d) of the Example I.

e) Growth of the Set of Optically Active Layers 5

In this example for growth of two quantum wells the following procedure has been applied. Substrate 1 with layers 2, 3 and 4 was heated to 620° C. The Ga effusion cell was heated to 963° C., additional Ga effusion cell was heated to 969° C. (effusion cell made by Oxford Instruments, VG-40cc/KM-28 standard—the Ga flux as a function of the temperature for this cell is given on FIG. 6), the Si effusion cell was heated to 1180° C., the In effusion cell was heated to 890° C. The parameters of the plasma source was established according to step b) of Example I. Then Ga, In cells' and N plasma source's shutters were opened for 36 seconds and 3 nm of $In_{0.12}Ga_{0.88}N$ was grown. Then the shutters of Si and additional Ga effusion cells were opened for 84 seconds and 7 nm of $In_{0.02}Ga_{0.98}N$ doped with Si at the level $5\times10^{18}$ cm$^{-3}$ was grown. Then shutters of the Si and additional Ga effusion cells' were closed and for 36 seconds 3 nm of $In_{0.12}Ga_{0.88}N$ was grown.

Then the shutters of Ga, In cells and N plasma source were closed.

The growth of the layers 6, 7 and 8 was performed according steps f) to h) of the Example I.

Example V

Design and fabrication of semiconductor laser diode, where optically active region 5 consists of 2 InGaN/InGaN quantum wells on the base of gallium nitride, indium nitride aluminum nitride and its alloys, which emits light at the wavelength of 408 nm where active region 5 is made with use of two ga sources. the electron blocking layer is located after last quantum well and upper cladding layer comprise one InAlGaN layer doped with magnesium.

a) Preparation of the substrate 1 and growth of the layers from 2 to 6 were made according to steps a) to f) of the Example IV.

g) Growth of the p-Type Upper Cladding Layer 7.

The substrate 1 with layers from 2 to 6 was heated to 620° C. The Ga effusion cell was heated to 962° C., the In effusion cell was heated to 890° C., the Al effusion cell was heated to 1025° C. and Mg effusion cell—to 420° C. The parameters of the plasma source was established according to step b) of the Example I. Then Al, Ga, In, Mg cells' and N plasma source's shutters were opened for 70 minutes and 0.35 μm of $In_{0.02}Al_{0.08}Ga_{0.9}N$ doped with Mg at the level of $7\times10^{19}$ cm$^{-3}$ was grown. Then Ga, In, Mg cells' and N plasma source's shutters were closed. The growth of layer 8 was performed according to step h) in the Example I.

Example VI

Design and fabrication of semiconductor laser diode, where optically active region 5 consists of two InGaN/InGaN quantum wells on the base of gallium nitride, indium nitride aluminum Nitride and its Alloys, which Emits Light at the Wavelength of 500 nm.

a) Preparation of the substrate 1 and growth of the layers 2, 3 and 4 were made according to steps a) to d) of the Example I.

e) Growth of the Optically Active Layers 5

In this example for growth of two quantum wells the following procedure has been applied. The substrate 1 with layers 2, 3 and 4 was heated to 600° C. The Ga effusion cell was heated to 934° C., additional Ga effusion cell was heated to 975° C. (effusion cell made by Oxford Instruments, VG-40cc/KM-28 standard), the Si effusion cell was heated to 118° C. and the In effusion cell was heated to 900° C. The parameters of the plasma source was established according to step b) of the Example I. Then Ga, In cells' and N plasma source's shutters were opened for 24 seconds and 2 nm of $In_{0.46}Ga_{0.54}N$ was grown. Then the shutters of Si and additional Ga effusion cells were opened for 84 seconds and 7 nm of $In_{0.2}Ga_{0.8}N$ doped with Si at the level $5\times10^{18}$ cm$^{-3}$ was grown. Then shutters of the Si and additional Ga effusion cells were closed and for 24 seconds 2 nm of $In_{0.46}Ga_{0.54}N$ was grown. Then the shutters of Ga, In cells and N plasma source were closed. The growth of the layers 6, 7 and 8 was performed according steps f) to h) of the Example I.

Example VII

Design and fabrication of semiconductor laser diode, where optically active region 5 consists of 2 InGaN/InGaN quantum wells on the base of gallium nitride, indium nitride aluminum nitride and its alloys, which emits light at the wavelength of 460 nm a) Preparation of substrate 1 and growth of the layers 2, 3 and 4 were made according steps from a) to d) of the Example I.

e) Growth of the Optically Active Layers 5

In this example for growth of two quantum wells the following procedure has been applied: Substrate 1 with layers 2, 3 and 4 was heated to 605° C. The Ga effusion cell was heated to 942° C., additional Ga effusion cell was heated to 975° C. (effusion cell made by Oxford Instruments, VG-40cc/KM-28 standard), the Si effusion cell was heated to 1180° C., the In effusion cell was heated to 900° C. The parameters of the plasma source was established according to step b) of the Example I. Then Ga, In cells' and N plasma source's shutters were opened for 24 seconds and 2 nm of $In_{0.3}Ga_{0.7}N$ was grown. Then the shutters of Si and additional Ga effusion cells were opened for 84 seconds and 7 nm of $In_{0.04}Ga_{0.96}N$ doped with Si at the level $5\times10^{18}$ cm$^{-3}$ was grown. Then shutters of the Si and additional Ga effusion cells were closed and for 24 seconds 2 nm of $In_{0.3}Ga_{0.7}N$ was grown. Then the shutters of Ga, In cells and N plasma source were closed. The growth of the layers 6, 7 and 8 was performed according step f) to h) of the Example I.

Example VIII

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm on HVPE substrate with dislocation density less than $10^7$ cm$^{-2}$.

a) Substrate Preparation

Preparation of GaN Substrate Grown by HVPE on Sapphire with Dislocation Density Less than $10^7$ cm$^{-2}$ was made according to method described in the Polish patent No 180448. As a result of such procedure there was obtained a crystal surface covered by atomic steps of the width which is related with the degree of crystal disorientation. Next, the back side of the crystal substrate 1 was covered by 1 μm of molybdenum. Molybdenum layer allows for uniform heating of the substrate during the growth in MBE. Mounting of the crystalline substrates 1 for MBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs 9 is located in some distance from MBE heater and the heating of the substrate 1 is realized by absorption of radiation from the heater (maximum of radiation energy is in the infrared region). Substrate prepared in such way was loaded to VG-90 Oxford Instruments MBE system. Then it was outgases in outgas stage for 24 hours in 450° C. and then for 30 minutes in 600° C. After reaching the vacuum level below $1\times10^{-10}$ torr, substrate was transferred to the growth chamber. Next steps of laser diode growth—described in point b) to h) of the Example I—was made in growth chamber of VG-90 Oxford Instruments MBE system.

Example IX

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm on free standing HVPE substrate with dislocation density less than $10^6$ cm$^{-2}$.

a) Substrate Preparation

The 200 μm thick GaN substrate grown by HVPE (which were removed from HVPE substrate) with dislocation density less than $10^6$ cm$^{-2}$ is prepared for growth in the way described in the Polish patent No 180448. As a result of such procedure it was obtained the crystal surface covered by atomic steps of the width which is related with the degree of crystal disorientation. Next, the back side of the crystal 1 was covered by 1 μm of molybdenum. Molybdenum layer allows for uniform heating of the substrate during the growth in MBE. Mounting of the crystalline substrates for UBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs 9 is located in some distance from MBE heater and the heating of the substrate 1 is realized by absorption of radiation from the heater (maximum of radiation energy is in the infrared region). Substrate 1 prepared in such way was loaded to VG-90 Oxford Instruments MBE system. Then it was outgases in outgas stage for 24 hours in 450° C. and then for 30 minutes in 600° C. After reaching the vacuum level below $1\times10^{-10}$ torr, substrate was transferred to the growth chamber. Next steps of laser diode growth—described in points b) to h) of the Example I—was made in growth chamber of VG-90 Oxford Instruments MBE system.

Example X

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm on free standing hype substrate with dislocation density less than $10^5$ $cm^{-2}$.
a) Substrate Preparation The 200 μm thick GaN substrate grown by HVPE (which were removed from HVPE substrate) with dislocation density less than $10^5$ $cm^{-2}$ is prepared for growth in the way described in the Polish patent No 180448. As a result of such procedure it was obtained the crystal surface covered by atomic steps of the width which is related with the degree of crystal disorientation. Next, the back side of the crystal 1 was covered by 1 μm of molybdenum. Molybdenum layer allows for uniform heating of the substrate during the growth in MBE. Mounting of the crystalline substrates for MBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs is located in some distance from MBE heater and the heating of the substrate 1 is realized by absorption of radiation from the heater (maximum of radiation energy is in the infrared region). Substrate 1 prepared in such way was loaded to VG-90 Oxford Instruments MBE system. Then it was outgases in outgas stage for 24 hours in 450° C. and then for 30 minutes in 600° C. After reaching the vacuum level below $1\times10^{-10}$ torr, substrate 1 was transferred to the growth chamber. Next steps of laser diode growth described in points b) to h) was made in growth chamber of VG-90 Oxford Instruments MBE system.

Example XI

Design and fabrication of semiconductor laser diode, where optically active region 5 consists of two InGaN/InGaN quantum wells on the base of gallium nitride, indium nitride aluminum nitride and its alloys, which emits light at the wavelength of 403 nm on nonpolar oriented free standing HVPE
a) Substrate Preparation The 2 mm thick GaN substrate grown by HVPE (which were removed from HVPE substrate) with dislocation density less than $10^5$ $cm^{-2}$ is prepared for growth on the plane perpendicular to a axis (1120) in the way described in the Polish patent No 180448. As a result of such procedure it was obtained the crystal surface covered by atomic steps of the width which is related with the degree of crystal disorientation. Next, the back side of the crystal 1 was covered by 1 μm of molybdenum. Molybdenum layer allows for uniform heating of the substrate during the growth in MBE. Mounting of the crystalline substrates for MBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs is located in some distance from MBE heater and the heating of the substrate 1 is realized by absorption of radiation from the heater (maximum of radiation energy is in the infrared region). Substrate 1 prepared in such way was loaded to VG-90 Oxford Instruments MBE system. Then it was outgases in outgas stage for 24 hours in 450° C. and then for 30 minutes in 600° C. After reaching the vacuum level below $1\times10^{-10}$ torr, substrate was transferred to the growth chamber. Next steps of laser diode growth—described in points b) to h) of the Example I—was made in growth chamber of VG-90 Oxford Instruments MBE system.

Example XII

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm on ELOG substrate with dislocation density less than $10^7$ $cm^{-2}$.
a) Substrate Preparation The GaN ELOG substrate grown by MOVPE with dislocation density less than $10^7$ $cm^{-2}$ is prepared for growth in the way described in the Polish patent No 180448. As a result of such procedure it was obtained the crystal surface covered by atomic steps of the width which is related with the degree of crystal disorientation. Next, the back side of the crystal 1 was covered by 1 μm of molybdenum. Molybdenum layer allows for uniform heating of the substrate during the growth in MBE. Mounting of the crystalline substrates for MBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs 9 is located in some distance from MBE heater and the heating of the substrate 1 is realized by absorption of radiation from the heater (maximum of radiation energy is in the infrared region). Substrate prepared in such way was loaded to VG-90 Oxford Instruments MBE system. Then it was outgases in outgas stage for 24 hours in 450° C. and then for 30 minutes in 600° C. After reaching the vacuum level below $1\times10^{-10}$ torr, substrate was transferred to the growth chamber. Next steps of laser diode growth—described in points b) to h) of the Example I—was made in growth chamber of VG-90 Oxford Instruments MBE system.

Example XIII

Design and fabrication of semiconductor laser diode, where optically active region 5 consists of two InGaN/InGaN quantum wells on the base of gallium nitride, indium nitride aluminum nitride and its alloys, which emits light at the wavelength of 500 nm made on GaN crystalline substrate with dislocation density less than $10^3$ $cm^{-2}$ grown by high pressure method.
a) Substrate Preparation The GaN substrate grown by high pressure method (described e.g. in paper by I. Grzegory, *J. Phys. Condens. Matter* 14, 11055 (2002)) with dislocation density less than $10^7$ $cm^{-2}$ is prepared for growth in the way described in the Polish patent No 180448. As a result of such procedure it is obtained the crystal surface covered by atomic steps of the width which is related with the degree of crystal disorientation. Next, the back side of the crystal 1 was covered by 1 μm of molybdenum. Molybdenum layer allows for uniform heating of the substrate during the growth in MBE. Mounting of the crystalline substrates for MBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs 9 is located in some distance from MBE heater and the heating of the substrate 1 is realized by absorption of radiation from the heater (maximum of radiation energy is in the infrared region). Substrate 1 prepared in such way was loaded to VG-90 Oxford Instruments MBE system. Then it was outgases in outgas stage for 24 hours in 450° C. and then for 30 minutes in 600° C. After reaching the vacuum level below $1\times10^{-10}$ torr, substrate was transferred to the growth chamber. Next steps of laser diode growth—described in points b) to h) of the Example I—was made in growth chamber of VG-90 Oxford Instruments MBE system. Growth of layers 2, 3 and 4 was performed according to steps a) to d) of the Example I.

e) Growth of the Optically Active Layers 5

In this example for growth of two quantum wells the following procedure has been applied. The substrate 1 with layers 2, 3 and 4 was heated to 600° C. The Ga effusion cell was heated to 934° C., additional Ga effusion cell was heated to 975° C. (effusion cell made by Oxford Instruments, VG-40cc/KM-28 standard), the Si effusion cell was heated to 1180° C., the In effusion cell was heated to 900° C. The parameters of the plasma source was established according to point b) of the Example I. Then Ga, In cells' and N plasma source's shutters were opened for 24 seconds and 2 nm of $In_{0.46}Ga_{0.54}N$ was grown. Then the shutters of Si and additional Ga effusion cells were opened for 84 seconds and 7 nm of $In_{0.2}Ga_{0.8}N$ doped with Si at the level $5\times10^{18}$ cm$^{-3}$ was grown. Then shutters of the Si and additional Ga effusion cells were closed and for 24 seconds 2 nm of $In_{0.46}Ga_{0.54}N$ was grown. Then the shutters of Ga, In cells and N plasma source were closed. The growth of the layers 6, 7 and 8 was performed according steps f) to h) of the Example I.

Example XIV

Design and fabrication of semiconductor laser diode, where optically active region 5 consists of two InGaN/InGaN quantum wells on the base of gallium nitride, indium nitride aluminum nitride and its alloys, which emits light at the wavelength of 950 nm.

a) Preparation of the substrate 1 and growth of the layer 2, were made according to steps a) and b) of the Example XI.

c) Growth of the Bottom n-Type Cladding Layer 3

In the growth chamber, the substrate 1 with the buffer layer 2 was heated to 710° C. and parameters of the plasma source was established according to point b) of the Example I. The Ga effusion cell was heated to 1010° C., Si effusion cell to 1180° C. Then the Ga, Si and N plasma source shutters were opened and for 100 minutes 0.5 μm of GaN doped with the Si at the level $5\times10^{18}$ cm$^{-3}$ was grown (Si concentration was determined by SIMS). Then the Ga, Si cells' and N plasma source's shutters were closed.

d) Growth of the Bottom n-Type Waveguide Layer 4

The substrate 1 with layers 2 and 3 was heated to 600° C. The Ga effusion cell was heated to 934° C., additional Ga source—to 975° C., the In effusion cell was heated to 900° C. and Si effusion cell was heated to 1180° C. The parameters of the N plasma source was established according to point b) of the Example I. After opening In, Ga, Si cell's and N plasma source's shutters for 20 minutes, 0.1 μm of $In_{0.46}Ga_{0.54}N$ doped with Si at the level of $5\times10^{18}$ cm$^{-3}$ was grown (Si concentration was determined by SIMS). Then the Ga, In, Si cells' and N plasma source's shutters were closed.

e) Growth of the Set of Optically Active Layers 5

The following procedure has been applied for growth of two quantum wells. Substrate 1 with layers 2, 3 and 4 was heated to 600° C. The Ga effusion cell was heated to 934° C., the Si effusion cell was heated to 1180° C., the In effusion cell was heated to 900° C. The parameters of the N plasma source was established according to point b) of the Example I. Then In cell's, and N plasma source's shutters were opened for 18 seconds and 1.5 nm of InN was grown. Then the shutters of Si and Ga effusion cells were opened for 84 seconds and 7 nm of $In_{0.46}Ga_{0.54}N$ doped with Si at the level $5\cdot10^{18}$ cm$^{-3}$ was grown. Then shutters of the Si and Ga effusion cells were closed and for 18 seconds 1.5 nm of InN was grown. Then the shutters of Ga, In cells and N plasma source were closed.

f) Growth of the Upper Waveguide Layer 6

The substrate 1 with layers 2, 3, 4 and 5 was heated to 600° C., the Ga effusion cell was heated to 970° C. and the In effusion cell was heated to 900° C. and Mg effusion cell (Oxford VG40cc/KM-28 standard)—to 420° C. The parameters of the plasma source was established according to step b) of the Example I. Then Ga, In, Mg cells' and N plasma source's shutters were open for 4 minutes and 20 nm of $In_{0.02}Ga_{0.82}N$ doped with Mg at the level of $7\times10^{18}$ cm$^{-3}$ was grown. It was electron blocking layer. Then Ga, In, Mg cells' and N plasma source's shutters were closed. Then Ga effusion cell was heated to 934° C., the In effusion cell was heated to 900° C. and the Mg effusion cell was heated to 420° C. Then the Ga, In, Mg cells' and N plasma source's shutters were open for 14 minutes and 70 nm of $In_{0.46}Ga_{0.54}N$ doped with Mg were grown. Then the Ga, In, Mg cells' and N plasma source's shutters were closed.

g) Growth of Upper p-Type Cladding Layer 7

The substrate 1 with layers 2, 3, 4, 5 and 6 was heated to 620° C., the Ga effusion cell was heated to 970° C. and the In effusion cell was heated to 890° C. and Mg effusion cell to 420° C. The parameters of the N plasma source was established according to step b) of the Example I. Then Ga, In, Mg cells' and N plasma source's shutters were open for 80 minutes and 0.4 μm of $In_{0.02}Ga_{0.98}N$ doped with Mg was grown. Then Ga, In, Mg cell's and N plasma source's shutters were closed.

h) Growth of the Contact Layer 8

Substrate 1 with layers from 2 to 7 was heated to 620° C. The Ga effusion cell was heated to 963° C., the In effusion cell was heated to 890° C. and Mg effusion cell to 420° C. The parameters of the N plasma source was established according to step b) of the Example I. Then Ga, In, Mg cells' and N plasma source's shutters were open for 4 minutes and 20 nm of $In_{0.12}Ga_{0.88}N$ doped with Mg was grown. Then Ga, In, Mg cells' and N plasma source's shutters were closed and substrate 1 with layers from 2 to 8 was cooled down to 30° C. and removed from MBE.

Example XV

Design and fabrication of semiconductor laser diode, where optically active region 5 consists of two AlGaN/AlGaN quantum wells on the base of gallium nitride, indium nitride aluminum nitride and its alloys, which emits light at the wavelength of 260 nm.

a) Substrate Preparation

AlN crystalline substrate 1 was prepared for growth according invention in the Polish patent No. 180448. As a result of such procedure it was obtained the crystal surface covered by atomic steps of the width which is related with the degree of crystal disorientation. For disorientation equal to 1° width of the atomic steps was equal to 14.3 nm. Next, the back side of the crystal 1 was covered by 1 μm of molybdenum. Molybdenum layer allows for uniform heating of the substrate during the growth in MBE. Mounting of the crystalline substrates for MBE growth is in the way called "gravity mounting" which relay on the hanging of the substrate 1 on special springs 9 and subsequent covering the substrate by sapphire plate 10. Molybdenum retaining ring 11 allows mechanical stability of this mounting. System with the springs 9 is located in some distance from MBE heater and the heating of the substrate 1 is realized by absorption of radiation from the heater (maximum of radiation energy is in the infrared region). Substrate 1 prepared in such way was loaded to VG-90 Oxford Instruments MBE system. Then it was outgases in outgas stage for 24 hours in 450° C. and then for 30 minutes in 600° C. After reaching the vacuum level below 1×10−10 torr, substrate 1 was transferred to the growth chamber. Next steps of laser diode growth—described in points b) to h) of this Example—was made in growth chamber of VG-90 Oxford Instruments MBE system.

b) Growth of Buffer Layer 2

In growth chamber substrate 1 (in vacuum conditions better than $5\times10^{-10}$ torr) was heated to 710° C. The Ga effusion cell is heated to 972° C., the Al effusion cell is heated to 1138° C. and Si effusion cell—to 1180° C. Then the flow of high purity nitrogen (at the level better than 1 ppb) was established at the level of 1 sccm. The nitrogen flow was controlled by mass flow controller. Then the RF plasma source was switched on (Unibulb EPI-RFS-450-G-N made by Veeco) at power of 240 W. After opening the Al, Ga, Si cells' and N plasma source's shutters for 20 minutes, the 0.1 μm of $Al_{0.95}Ga_{0.05}N$ doped with Si was grown. The Si doping level was $5\times10^{18}$ cm$^{-3}$. Then the Al, Ga, Si cells' and N plasma source's shutters were closed.

c) Growth of the Bottom Cladding Layer 3

In the growth chamber, the substrate 1 with the buffer layer 2 was heated to 710° C. (in vacuum conditions better than $5\times10^{-10}$ torr) The of Ga effusion cell is heated to 972° C., the Al effusion cell to 1138° C. and Si effusion cell—to 1180° C. Next the flow of high purity nitrogen (at the level better than 1 ppb) was established at the level of 1 sccm. The nitrogen flow was controlled by mass flow controller. Then the RF plasma source was switched on (Unibulb EPI-RFS-450-G-N made by Veeco) at power of 240 W. Then the Ga, Al, Si cells' and N plasma source's shutters were opened. Then for 80 minutes 0.4 μm of $Al_{0.95}Ga_{0.05}N$ doped with the Si at the level of $5\times10^{18}$ cm$^{-3}$ was grown. Then the Ga, Al, Si cells' and N plasma source's shutters were closed.

d) Growth of the Bottom n-Type Waveguide Layer 4

The substrate 1 with layers 2 and 3 was heated to 710° C. The Ga effusion cell was heated to 958° C., Si effusion cell was heated to 1180° C., Al effusion cell was heated to 1122° C. The parameters of the N plasma source was established according to step b) of the Example I. Then the Ga, Al, Si cells' and N plasma source's shutters were opened. Then for 20 minutes 0.1 μm of $Al_{0.95}Ga_{0.05}N$ doped with the Si was grown. Then the Ga, Al, Si cells' and N plasma source's shutters were closed.

e) Growth of the Optically Active Layers 5

The substrate 1 with layers 2 to 4 was heated to 710° C. and parameters of the plasma source was established according to point b) of Example I. The Ga effusion cell was heated to 991° C., the Al effusion cell to 1100° C. Then the Ga, Al and N plasma source shutters were opened for 24 second and 2 nm of $Al_{0.5}Ga_{0.5}N$ was grown. Then the Ga, Al, and N plasma source shutters were closed. Then the Ga effusion cell was heated to 970° C., Si effusion cell was heated to 1180° C. The parameters of the plasma source was established according to point b) of example I. Then the Ga, Al, Si cells' and N plasma source's shutters were opened for 84 second and 7 nm of $Al_{0.7}Ga_{0.3}N$ was grown. Then the Ga, Al, Si cells' and N plasma source's shutters were closed.

Then the Ga effusion cell was heated to 991° C., the Al effusion cell to 1100° C. Then the Ga, Al cells' and N plasma source's shutters were opened for 24 second and 2 nm of $Al_{0.5}Ga_{0.5}N$ was grown. Then the Ga, Al cells' and N plasma source's shutters were closed.

f) Growth of the Upper Waveguide Layer 6

The substrate 1 with layers 2 to 5 was heated to 620° C., the In effusion cell was heated to 890° C., the Al effusion cell was heated to 1138° C. and Mg effusion cell to 420° C. The parameters of the plasma source was established according to point b) of Example I. Then Al, In, Mg cells' and N plasma source's shutters were open for 4 minutes and 20 nm of $In_{0.05}Al_{0.95}N$ doped with Mg was grown. It is electron blocking layer. The amount of hydrogen in electron blocking layer measured by SIMS was lower than $1\times10^{17}$ cm$^3$. Then Al, In, Mg cells' and N plasma source's shutters were closed. The Ga effusion cell was heated to 910° C., the In effusion cell was heated to 890° C., the Al effusion cell was heated to 1122° C. and the Mg effusion cell was heated to 420° C. Then the Ga, In, Mg cells' and N plasma source's shutters were open for 14 minutes and 70 nm of $In_{0.02}Al_{0.7}Ga_{0.28}N$ doped with Mg were grown. Then the Ga, In, Mg cell's and N plasma source's shutters were closed.

g) Growth of Upper p-Type Cladding Layer 7

The substrate 1 with layers 2 to 6 was heated to 620° C., the In effusion cell was heated to 890° C., the Al effusion cell was heated to 1138° C. and Mg effusion cell—to 420° C. The parameters of the N plasma source was established according to step b) of the Example I. Then Al, In, Mg cells' and N plasma source's shutters were open for 80 minutes and 0.4 μm of $In_{0.05}Al_{0.95}N$ doped with Mg was grown. Then Al, In, Mg cells' and N plasma source's shutters were closed.

h) Growth of the Contact Layer 8

Substrate 1 with layers 2 to 7 was heated to 620° C. The Ga effusion cell was heated to 970° C., the In effusion cell was heated to 890° C. and Mg effusion cell to 420° C. The parameters of the N plasma source was established according to step b) of the Example I. Then Ga, In, Mg cells' and N plasma source's shutters were open for 40 minutes and 0.2 μm of $In_{0.02}Ga_{0.98}N$ doped with Mg was grown. Then Ga, In, Mg cells' and N plasma source's shutters were closed and substrate 1 with layers 2 to 8 was cooled down to 30° C. and then removed from MBE.

Example XVI

Design and fabrication of semiconductor laser diode, where optically active region 5 consists of two InGaN/InGaN quantum wells on the base of gallium nitride, indium nitride aluminum nitride and its alloys, which emits light at the wavelength of 408 nm made with use of two Ga sources and bottom cladding layer comprise strain compensated InGaN layer.

a) Preparation of the substrate 1 and growth of the layer 2 were made according to steps a) and b) of the Example I.

c) Growth of the n-Type Bottom Cladding Layer 3

In the growth chamber, the substrate 1 with the buffer layer 2 was heated to 620° C. The Ga effusion cell was heated to 963° C., the In effusion cell to 890° C., Si effusion cell to 1180° C. The parameters of the N plasma source was established according to step b) of the Example I. Then the Ga, In, Si cells' and N plasma source's shutters were opened for 20 minutes 0.1 μm of $In_{0.12}Ga_{0.88}N$ doped with the Si was grown. Then the Ga, Al, Si cells' and N plasma source's shutters were closed. Then the substrate 1 was heated to 710° C. and parameters of the plasma source was established according to point b) of example I. After heating of Ga effusion cell to 1007° C., Si effusion cell to 1180° C. and Al effusion cell to 1025° C. the Ga, Al, Si and N plasma source shutters were opened. Then for 120 minutes 0.6 μm of $Al_{0.08}Ga_{0.92}N$ doped with the Si at the level of $5 \xi 10^{18}$ cm$^{-3}$ was grown (Si concentration was determined by SIMS). Then the Ga, Al, Si cells' and N plasma source's shutters were closed.

The growth of the layers 4, 5, 6, 7 and 8 was performed according step d) to h) of the Example I.

The invention claimed is:

1. Nitride based laser diode, comprising
crystalline substrate on which in sequence a set of n-type layers, an optically active set of layers and a set of p-type layers is grown, while said set of n-type layers comprises at least a buffer layer, a bottom n-type cladding layer and a bottom n-type waveguide layer and whereas said set of p-type layers comprises at least an upper p-type waveguide layer containing an electron blocking layer (EBL),
an upper p-type cladding layer and a p-type contact layer, characterized in that the said electron blocking layer comprises a magnesium doped alloy $In_xAl_yGa_{1-x-y}N$ where $1>x>0.001$ and $1>y>0$ and wherein a hydrogen concentration in said electron blocking layer is less than $5\times10^{17}$ cm$^{-3}$.

2. Nitride based laser diode according to claim 1, characterized in that the upper p-type cladding layer (7) comprises a magnesium-doped set of layers, in which at least in one layer an indium content is higher than 0.001 and a hydrogen concentration in said upper p-type cladding layer is lower than $5\times10^{17}$ cm$^{-3}$.

3. Nitride based laser diode according to claim 1, characterized in that the upper p-type cladding layer (T) comprises a set of magnesium-doped layers in which in all layers an indium content is higher than 0.001.

4. Nitride based laser diode according to claim 1, characterized in that a hydrogen concentration in said p-type cladding layer (7) is lower than $5\times10^{17}$ cm$^{-3}$.

5. Nitride based laser diode according to claim 1, characterized in that the crystalline substrate (1) is a HVPE substrate with a dislocation density of less than $10^8$ cm$^{-2}$.

6. Nitride based laser diode according to claim 1, characterized in that the crystalline substrate (1) is an ELOG substrate with a dislocation density of less than $10^8$ cm$^{-2}$.

7. Nitride based laser diode according to claim 1 characterized by a dislocation density in said crystalline substrate (1) of less than $10^5$ cm$^{-2}$.

8. Nitride based laser diode according to claim 1, characterized in that the crystalline substrate (1) is a substrate made by a high pressure method and with a dislocation density of less of than $10^3$ cm$^{-2}$.

9. Method of manufacturing a nitride based semiconductor laser diode, based on epitaxially depositing on a crystalline substrate sequentionally a set of n-type layers, an optically active set of layers and a set of p-type layers, while said set of n-type layers comprises at least a buffer layer, a bottom n-type cladding layer and a bottom n-type waveguide layer and whereas said set of p-type layers comprise at least an upper p-type waveguide layer containing an electron blocking layer (EBL), an upper p-type cladding layer and a p-type contact layer, characterized in that the p-type waveguide layer (6) and the p-type cladding layer (7) are grown by PAMBE in the presence of indium.

10. Method according to claim 9, characterized in that the electron blocking layer is grown by PAMBE in the presence of indium and wherein the concentration of hydrogen in the electron blocking layer is less than $1\times10^{17}$ cm$^{-3}$.

11. Method according to claim 9, characterized in that the p-type cladding layer (7) is grown by PAMBE in the presence of indium.

12. Method according to claim 9, characterized in the said n-type cladding layer (3) is grown by PAMBE in the presence of indium.

13. Method according to claim 9, characterized in that HVPE substrates with dislocation density less than $10^8$ cm$^{-2}$ are used as said crystalline substrate (1).

14. Method according to claim 9, characterized in that an ELOG substrate with dislocation density less than $10^8$ cm$^{-2}$ is used as said crystalline substrate (1).

15. Method according to claim 9, characterized in that crystalline substrates with a dislocation density of less than $10^5$ cm$^{-2}$ are used as said crystalline Zsubstrate (1).

16. Method according to claim 9, characterized in that substrates made by a high pressure method and with a dislocation density of less than $10^3$ cm$^{-2}$ are used as said crystalline substrate (1).

17. A nitride based laser diode, comprising
a crystalline substrate;
a set of n-type layers grown on the crystalline substrate, wherein the set of n-type layers comprises at least a buffer layer, a bottom n-type cladding layer and
a bottom n-type waveguide layer;
a set of optically active layers grown onto the set of n-type layers;
a set of p-type layers grown onto the optically active set of layers,
wherein the set of p-type layers comprises at least an upper p-type waveguide layer containing an electron blocking layer (EBL), an upper p-type cladding layer and a p-type contact layer, wherein the electron blocking layer comprises a magnesium doped alloy $In_xAl_yGa_{1-x-y}N$, wherein $1>x>0.001$ and $1>y>0$ and wherein a hydrogen concentration in said electron blocking layer is less than $5\times10^{17}$ cm$^{-3}$.

18. A nitride based laser diode obtained by epitaxially depositing on a crystalline substrate sequentionally a set of n-type layers, an optically active set of layers and a set of p-type layers, while said set of n-type layers comprises at least a buffer layer, a bottom n-type cladding layer and a bottom n-type waveguide layer and whereas said set of p-type layers comprise at least an upper p-type waveguide layer containing an electron blocking layer (EBL) wherein a hydrogen concentration in said electron blocking layer is less than $5\times10^{17}$ cm$^{-3}$, an upper p-type cladding layer and a p-type contact layer, characterized
in that the p-type waveguide layer (6) and the p-type cladding layer (7) are grown by PAMBE in the presence of indium.

19. Nitride based laser diode according to claim 1,
wherein the hydrogen concentration in said electron blocking layer is less than $1\times10^{17}$ cm$^{-3}$.

* * * * *